(12) United States Patent
Perez et al.

(10) Patent No.: US 6,934,162 B2
(45) Date of Patent: Aug. 23, 2005

(54) CIRCUIT BOARD MOUNTING METHODS

(75) Inventors: Juan M. Perez, Tomball, TX (US); Jeffrey A. Lambert, Houston, TX (US); Donald J. Hall, Magnolia, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 612 days.

(21) Appl. No.: 10/098,105

(22) Filed: Mar. 14, 2002

(65) Prior Publication Data

US 2002/0089829 A1 Jul. 11, 2002

Related U.S. Application Data

(62) Division of application No. 09/523,835, filed on Mar. 13, 2000, now Pat. No. 6,385,051.

(51) Int. Cl.$^7$ ............................ H05K 5/00; H05K 5/04; H05K 5/06; H05K 7/14; H05K 7/18

(52) U.S. Cl. ...................... 361/759; 361/756; 361/801; 361/802

(58) Field of Search ................................. 361/800, 801, 361/802, 759, 756, 683, 686, 726, 732, 740, 747, 724–725, 728, 736, 741, 748, 752, 807; 312/223.1–223.3; 211/41.17, 26.2; 29/592, 592.1, 601, 825, 830–831, 846, 849

(56) References Cited

U.S. PATENT DOCUMENTS

| | | | | |
|---|---|---|---|---|
| 4,688,148 A | * | 8/1987 | Mallory et al. | ............. 361/740 |
| 5,031,070 A | * | 7/1991 | Hsu | ............. 361/683 |
| 5,191,513 A | | 3/1993 | Sugiura et al. | ............. 361/399 |
| 5,278,351 A | * | 1/1994 | Herrick | ............. 174/35 R |
| 5,466,059 A | * | 11/1995 | Liu | ............. 312/223.2 |
| 5,490,038 A | | 2/1996 | Scholder et al. | ............. 361/759 |
| 5,593,219 A | * | 1/1997 | Ho | ............. 312/263 |
| 5,691,504 A | | 11/1997 | Sands et al. | ............. 174/35 R |
| 5,713,647 A | * | 2/1998 | Kim | ............. 312/223.2 |
| 5,751,545 A | * | 5/1998 | Jung | ............. 361/683 |
| 5,754,396 A | | 5/1998 | Felcman et al. | ............. 361/683 |
| 5,785,533 A | * | 7/1998 | Baitz et al. | ............. 439/61 |
| 5,801,928 A | | 9/1998 | Burstedt et al. | ............. 361/801 |
| 5,822,182 A | * | 10/1998 | Scholder et al. | ............. 361/683 |
| 5,845,977 A | * | 12/1998 | Neukam et al. | ............. 312/223.2 |
| 5,963,432 A | * | 10/1999 | Crowley | ............. 361/804 |
| 6,015,195 A | * | 1/2000 | Anderson et al. | ............. 312/223.2 |
| 6,053,586 A | * | 4/2000 | Cook et al. | ............. 312/223.2 |
| 6,074,028 A | * | 6/2000 | Ho | ............. 312/223.2 |
| 6,114,622 A | * | 9/2000 | Draeger | ............. 174/35 R |
| 6,166,917 A | | 12/2000 | Anderson | ............. 361/756 |
| 6,205,020 B1 | * | 3/2001 | Felcman et al. | ............. 361/683 |
| 6,229,710 B1 | * | 5/2001 | Chen | ............. 361/759 |
| 6,252,160 B1 | * | 6/2001 | Chang et al. | ............. 174/35 R |
| 6,272,010 B1 | * | 8/2001 | Schmitt | ............. 361/685 |
| 6,278,617 B1 | * | 8/2001 | Yang et al. | ............. 361/818 |
| 6,288,333 B1 | * | 9/2001 | Liu et al. | ............. 174/52.1 |
| 6,313,983 B1 | * | 11/2001 | Liu et al. | ............. 361/683 |
| 6,337,793 B1 | * | 1/2002 | Vier et al. | ............. 361/683 |
| 6,359,214 B1 | * | 3/2002 | Worley et al. | ............. 174/35 GC |
| 6,362,975 B1 | * | 3/2002 | Liu et al. | ............. 361/796 |
| 6,373,690 B1 | * | 4/2002 | Buican et al. | ............. 361/683 |
| 6,373,692 B1 | * | 4/2002 | Cheng | ............. 361/683 |
| 6,392,874 B1 | * | 5/2002 | Gan | ............. 361/683 |
| 6,420,009 B1 | * | 7/2002 | Cheng | ............. 428/99 |
| 6,473,295 B2 | * | 10/2002 | Chen | ............. 361/683 |

* cited by examiner

*Primary Examiner*—Phuong T. Vu

(57) ABSTRACT

A screwless technique for mounting a circuit board in a computer chassis is provided in which circular portions of keyhole-shaped mounting openings in the circuit board body are first moved downwardly over notched chassis mounting bosses. The circuit board is then forwardly moved transversely to the bosses to move opening edge portions of the circuit board body into the boss notches in a manner releasably preventing the circuit board from being lifted off the bosses. A retaining bracket is placed adjacent a body edge of the installed circuit board to block the board against rearward releasing movement relative to the chassis bosses.

32 Claims, 5 Drawing Sheets

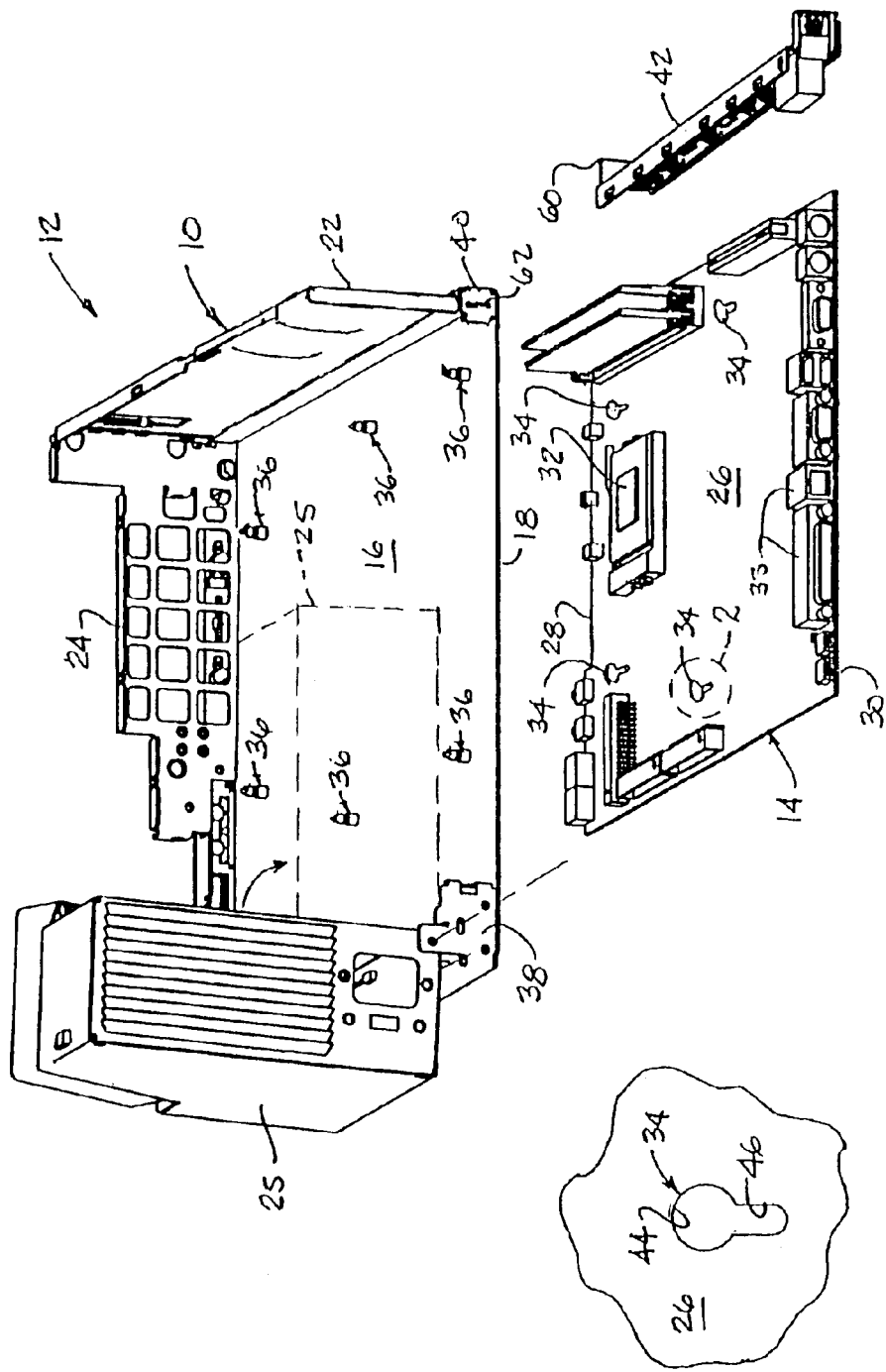

CIRCUIT BOARD MOUNTING METHODS

The following is a divisional of application Ser. No. 09/523,835, filed on Mar. 13, 2000 now U.S. Pat. No. 6,385,051.

BACKGROUND OF THE INVENTION

1. Field of the Invention

The present invention generally relates to electronic apparatus and, in a preferred embodiment thereof, more particularly relates to apparatus and methods for operatively mounting circuit boards on support structures such as computer chassis walls.

2. Description of Related Art

For many years, the conventional method of installing a circuit board, such as the motherboard, in a computer was to simply screw the board substrate to bosses or other mounting structures suitably mounted on a chassis wall portion of the computer. This circuit board installation method substantially increased the time, and thus the cost, required to construct the computer in addition to adding to the complexity and difficulty of assembling, and later disassembling and servicing the computer.

A relatively recent improvement in the mounting of a main circuit board in a computer is illustrated and described in U.S. Pat. No. 5,754,396 to Felcman et al entitled "MODULAR DESKTOP COMPUTER HAVING ENHANCED SERVICEABILITY In the desktop computer illustrated and described in this patent, the motherboard is mounted on a tray structure which may be slid into and out of the computer chassis to install and later remove the motherboard for access and service purposes.

While this tray support concept hastens and reduces the cost associated with initially installing the motherboard in the chassis and subsequently removing the motherboard for service and replacement, it also increases the manufacturing cost of the computer since the motherboard must be produced and spared with this auxiliary support tray secured thereto.

It thus can be seen from the foregoing that it would be desirable to provide for the cost effective, screwless installation and removal of a circuit board within a computer without the necessity of securing to the computer an auxiliary support tray or other cost increasing mounting structure. It is to this design goal that the present invention is directed.

SUMMARY OF THE INVENTION

In carrying out principles of the present invention, in accordance with a preferred embodiment thereof, electronic apparatus is provided which is representatively in the form of a desktop computer. The computer has a circuit board, illustratively a motherboard, and a support structure, representatively a chassis wall. According to a key aspect of the present invention, the circuit board is operatively secured to the chassis wall without the use of screws or any sort of support tray secured to the circuit board.

Using a screwless circuit board attachment technique of the present invention, cooperatively engaged locking structures are carried by the circuit board and the support structure. The cooperatively engaged locking structures releasably hold the circuit board on the support structure and permit removal of the circuit board from the support structure in response to sequential movement of the circuit board relative to the support structure in (1) a first direction and (2) a second direction transverse to the first direction. A retaining structure releasably blocks movement of the circuit board in the first direction relative to the support structure, thereby releasably retaining the circuit board on the support structure.

In a preferred embodiment of the screwless circuit board attachment apparatus, the openings have generally keyhole-shaped configurations and are formed in a substrate body portion of the circuit board, and the projections are carried on the chassis wall portion, extend partly through the substrate openings and have notch portions receiving opening edge portions of the substrate body portion.

To rapidly install the circuit board on the chassis wall projections, the substrate body openings are moved over outer end portions of the projections, and the substrate body is moved parallel to its plane to cause the opening edge portions to enter the notches on the projections and thereby block removal of the circuit board from the projections in a direction parallel to their lengths. A retaining bracket member is then moved into a position in which it blocks movement of the circuit board to move its opening edge portions out of the projection notches.

When it is later desired to remove the circuit board, the retaining bracket is simply moved away from its circuit board blocking position, the circuit board is moved transversely to the projections to remove its opening edge portions out of the projection notches, and the circuit board is lifted off the projections.

BRIEF DESCRIPTION OF THE DRAWINGS

FIG. 1 is a partially exploded rear side perspective view of a portion of a representative computer chassis and a motherboard installable in the chassis using unique screwless installation apparatus and methods embodying principles of the present invention;

FIG. 2 is an enlarged scale top plan detail view of the dashed circle area "2" in FIG. 1 illustrating a keyhole-shaped mounting opening formed in the motherboard substrate body;

DETAILED DESCRIPTION

Figures 3, 6:
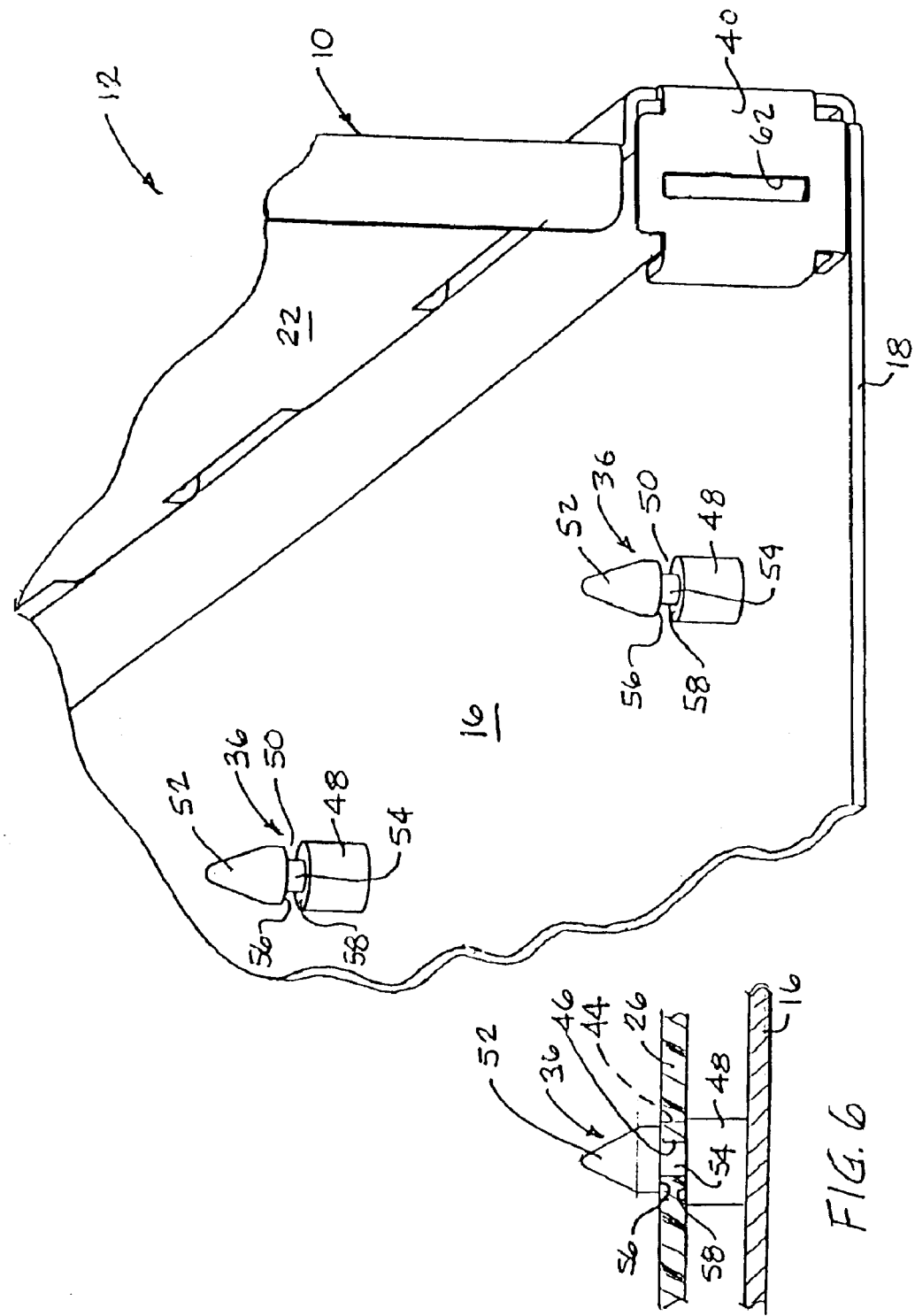
FIG. 3 is an enlarged scale perspective view of a rear corner portion of the chassis illustrating a pair of upwardly projecting mounting bosses on its bottom side wall, and a retaining bracket slot formed in the chassis.
FIG. 6 is an enlarged scale partially elevational cross-sectional view taken along line 6—6 of FIG. 4 and illustrating the manner in which the mounting bosses captively retain the motherboard in its installed orientation relative to the bottom chassis wall.
Figure 4:
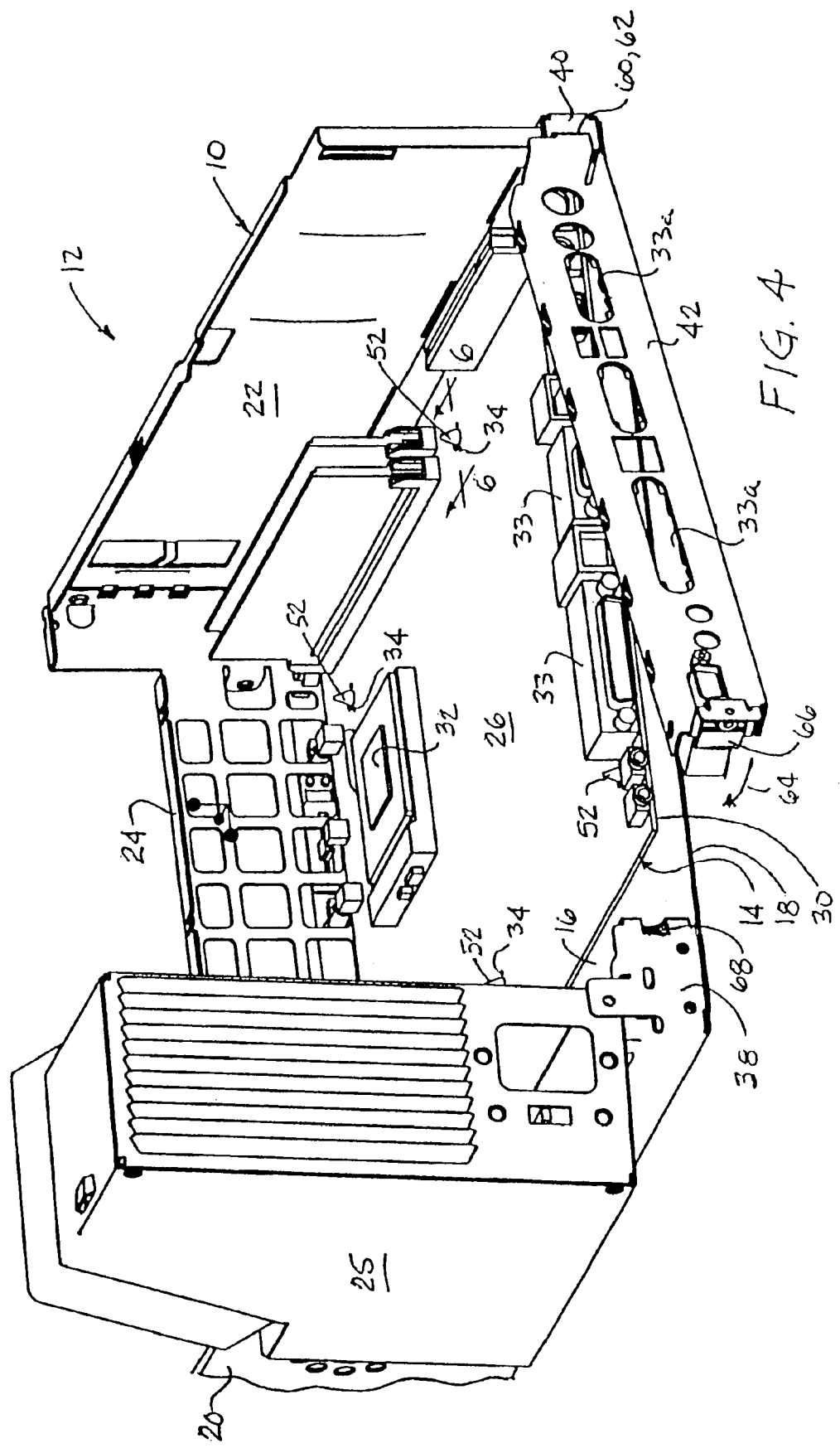
FIG. 4 is a rear side perspective view of the chassis with the motherboard mounted therein and a rear retaining bracket structure being secured to the chassis and ready to be pivoted forwardly to its board retaining position.

Perspectively illustrated in FIGS. 1, 3 and 4 is a bottom portion of a generally rectangular sheet metal chassis section 10 of a representative desktop computer 12 which also includes a main circuit board or "motherboard" 14. Motherboard 14 is installable in the chassis 10 using unique screwless installation apparatus and methods of the present invention as subsequently described herein. AS will be readily appreciated by those of skill in this particular art, various computer components, such as drive units and other components and interconnecting cabling and the like have been removed from the chassis interior for purposes of illustrative clarity. Additionally, the top cover portion of the overall chassis structure has been removed for illustrative purposes.

Chassis 10 has a bottom wall 16 with a rear side edge 18, left and right upstanding side walls 20 and 22, and an upstanding front wall 24 extending between the side walls 20 and 22. An electrical power supply unit 25 of conventional construction is supported on the left side wall 20 for pivotal movement relative thereto between a solid line vertically extending access orientation, and a dashed line operating orientation in which the power supply unit 25 is swung down into the chassis interior in an upwardly spaced relationship with the bottom chassis wall 16.

The motherboard 14 has a generally planar rectangular substrate body 26 having front and rear side edges 28 and 30, with various electronic components, including a central processing unit 32, being operatively mounted on the top side of the substrate body 26. Also mounted on the substrate body 26, along its rear edge 30 are a series of various input/output components 33. Formed through the substrate body 26 are several spaced apart mounting holes 34 which form part of the specially designed circuit board mounting system of the present invention. The mounting system also includes spaced apart, upstanding mounting bosses 36 secured to the bottom chassis wall 16, upstanding left and right rear corner plate portions 38 and 40 of the chassis, and an elongated retaining bracket structure 42.

As best illustrated in FIG. 2, each of the motherboard substrate body mounting holes 34 is generally keyhole-shaped, having a circular main portion 44 from which a narrowed straight portion 46 radially outwardly projects. Each of the upwardly projecting mounting bosses (see FIG. 3) Includes a cylindrical base portion 48, an annular, vertically intermediate notch 50, and a generally conically-shaped upper end portion 52. A reduced diameter intermediate cylindrical portion 54 vertically extends between the base portion 48 and the conical upper end portion 52, and annular upper and lower ledges 56,58 are formed by the notch 50.

To rapidly mount the motherboard 14 within the interior of the chassis 10, without the use of separate fasteners of any sort or securing a tray or other type of mounting structure to the motherboard, the motherboard 14 is simply placed above the bottom chassis wall 16, with the upstanding chassis mounting bosses 36 in alignment with the circular portions 44 of the substrate body holes 34 (see FIG. 2). Next, the motherboard 14 is lowered to cause the conical upper end portions of 52 of the mounting bosses 36 (see FIG. 3) to extend upwardly through the hole portions 44, and then forwardly shifted relative to the mounting bosses 36 to cause the vertically intermediate boss portions 54 to enter the narrowed radial substrate body hole portions 46, with the upper and lower annular boss portions 56,58 respectively overlying and underlying top and bottom side portions of the substrate body 26 as cross-sectionally illustrated in FIG. 6.

As described above, the substrate body 26, and thus the entire motherboard 14, are releasably locked to the bottom chassis wall 16 via the interlockable, or cooperatively engaged, locking assembly comprising the mounting holes 34 and the bosses 36.

The substrate body 26, and corresponding mounting holes 34, is disposed onto the bosses 36 in a manner such that, to remove the substrate body 26 from the bosses 36, the substrate body 26 must be moved rearwardly to remove the intermediate boss portions 54 from the radial hole portions 46, and then lifted to move the circular hole portions 44 upwardly past the upper conical boss portions 52 to free the substrate body 26 from the bosses 36.

Figure 5:
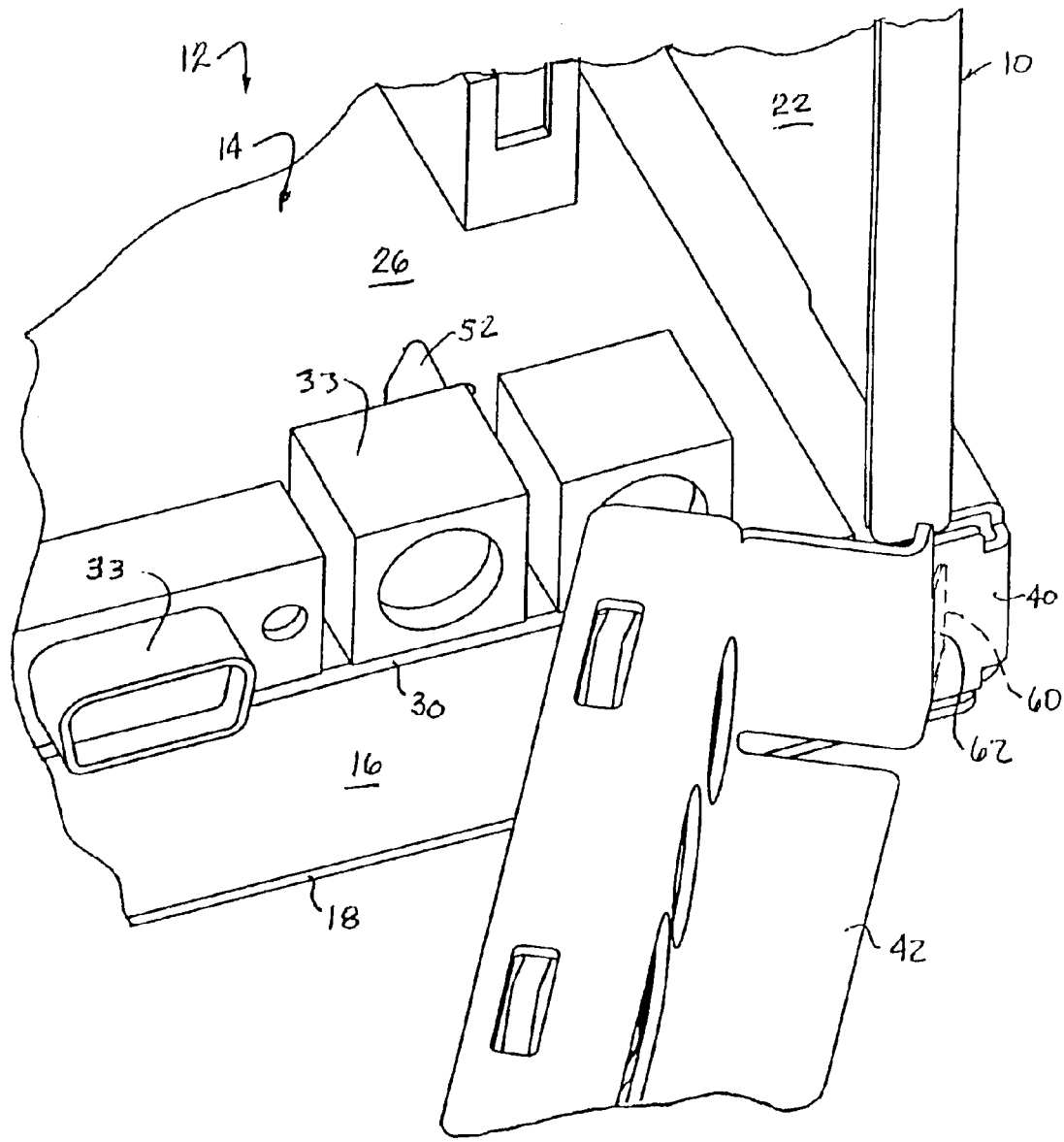
FIG. 5 is an enlarged scale perspective detail of a rear corner portion of the chassis illustrating the manner in which the retaining bracket structure is removably secured to the chassis.
Figure 7:
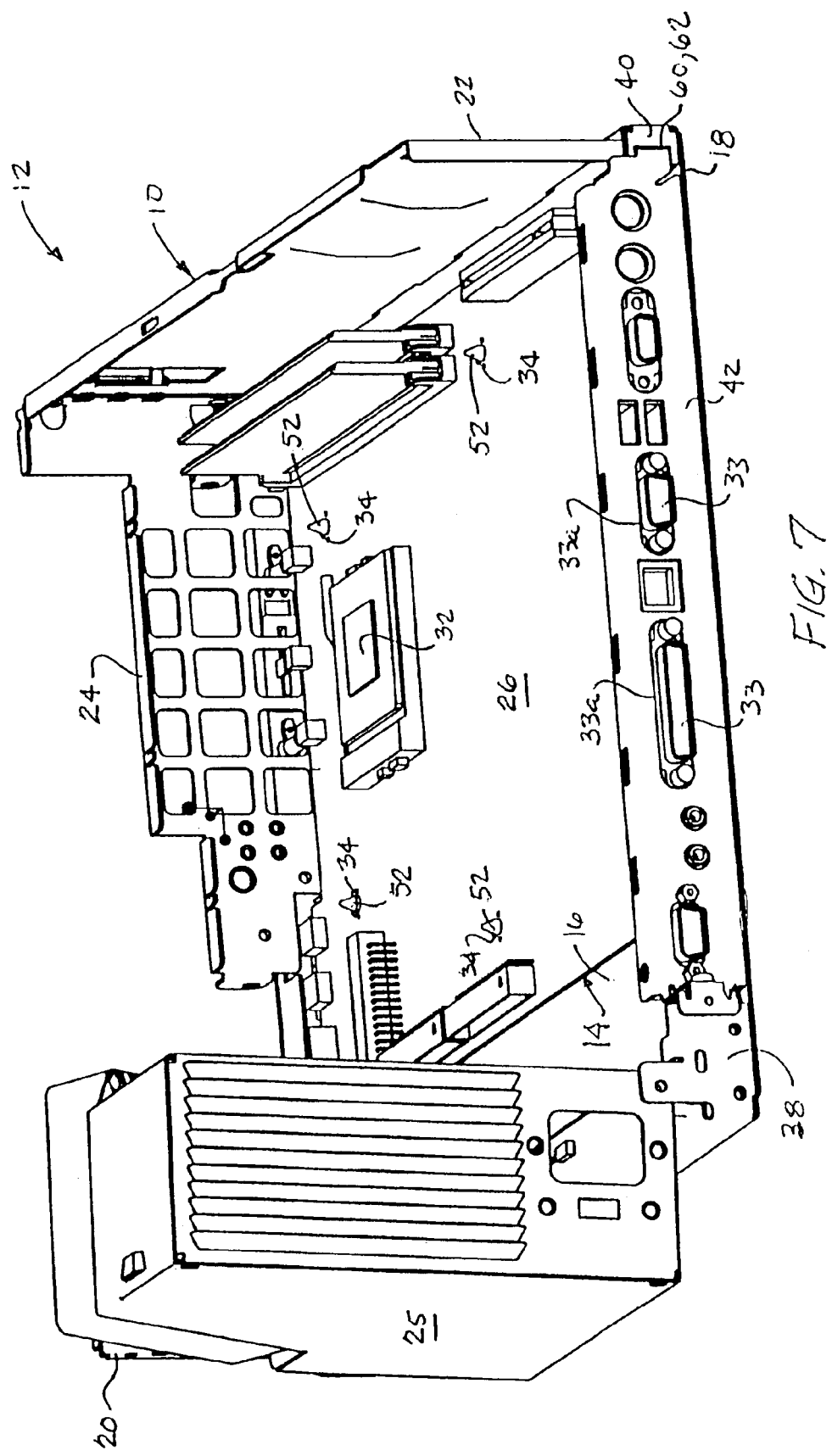
FIG. 7 is a rear side perspective view of the chassis illustrating the motherboard installed therein and captively retained within the chassis by the retaining bracket structure which has been swung inwardly to its locking position.

Such rearward shifting of the installed motherboard 14 relative to the bosses 36 is releasably prevented, thereby captively retaining the motherboard 14 on the bosses 36, using the retaining bracket 42. After the motherboard 14 is dropped onto and forwardly shifted relative to the bosses 36 as just described, a small outwardly projecting tab 60 on the right end of the retaining bracket 42 (see FIGS. 1, 4 and 5) is inserted into a vertical slot 62 formed in the right rear corner plate portion 40 of the chassis 10 (see FIGS. 1, 3 and 5). The retaining bracket 42 is then pivoted horizontally toward the rear edge 30 of the motherboard 14, as indicated by the arrow 64 in FIG. 4, until an outwardly projecting tab 66 on the left end of the retaining bracket 42 enters and is latchingly received in a vertical slot 68 in the left rear corner plate portion 38 of the chassis 10 (see FIG. 4). This releasably locks the retaining bracket 42 in its FIG. 7 installed position in which it extends outwardly along and parallel to the rear side edge 30 (see FIG. 4) of the motherboard substrate body 26.

With the retaining bracket 42 in this installed orientation, an inner or front side portion of the bracket defines an abutment which prevents the substrate body 26 from being rearwardly shifted in a manner unlocking it from and permitting it to be lifted off of the chassis bosses 36. Additionally, suitable openings 33a are formed in the bracket 42 that, with the bracket 42 in its installed orientation, complementarily receive rear portions of the various input/output devices as illustrated in FIG. FIG. 7.

When it is desired to remove the motherboard 14 from the chassis 10, the retaining bracket 42 is simply pivoted outwardly and removed from the chassis 10, thereby permitting the motherboard 14 to be rearwardly shifted relative to and lifted off the bosses 36 to quickly and easily remove the motherboard 14 from the computer 12.

As can readily be seen from the foregoing, the present invention provides for the screwless installation and removal of a circuit board on and from a support structure in an electronic device such as a computer, without the use of a support tray attached to the circuit board. While the present invention has been representatively illustrated as being used in conjunction with a computer motherboard attachable to a sheet metal chassis wall, it will be readily appreciated by those of skill in this particular art that principles of the invention could also be advantageously employed in an application involving other types of circuit boards attachable to other types of support structures.

Additionally, while the interlocking structures used on the circuit board to effect this screwless circuit board mounting representatively comprised projections on the support structure and cooperating openings on the circuit board, it will be readily be appreciated that the projections could alternatively be formed on the circuit board, and the cooperating openings associated with the support structure, if desired.

The foregoing detailed description is to be clearly understood as being given by way of illustration and example only, the spirit and scope of the present invention being limited solely by the appended claims.

What is claimed is:

1. A screwless method of releasably locking a circuit board on a support structure, the method comprising the acts of:

extending projections disposed on one of the circuit board and the support structure in an insertion direction through openings disposed on a remaining one of the circuit board and the support structure;

moving the circuit board relative to the support structure in a locking direction transverse to the first direction and in a manner releasably interlocking the projections and the openings and preventing removal of the circuit board from the support structure in the insertion direction; and releasably preventing an unlocking movement of the circuit board relative to the support structure via a latchable panel.

2. The method of claim 1 wherein the act of releasably preventing the unlocking movement comprises the act of removably placing the latchable panel in a blocking relationship with an edge of the circuit board.

3. The method of claim 1 further comprising the acts of:

forming the projections on the support structure; and forming the openings on the circuit board.

4. The method of claim 3 further comprising the acts of:

providing the openings with generally keyhole-shaped configurations, and providing the projections with annular notches configured to receive opening edge portions of the circuit board.

5. The method of claim 4 wherein:

the support structure is a computer chassis wall, and the circuit board is a motherboard.

6. The method of claim 2, wherein the act of removably placing comprises the act of utilizing a removable wall section of the support structure as at least part of the latchable wall.

7. The method of claim 6, further comprising the act of associating a communications panel with the removable wall section for communications circuitry disposed on the circuit board.

8. A method of forming a tool-free mounting structure for a circuit board, comprising the acts of:

forming projections on one of the circuit board and a support structure;

creating openings on a remaining one of the circuit board and the support structure, wherein the projections are interlockable with the openings via a multi-directional motion of the circuit board; and providing a latchable wall section of the support structure adjacent an edge of the circuit board in a blocking position relative to at least one direction of the multi-directional motion.

9. The method of claim 8, wherein the act of forming the projections comprises the act of attaching boss structures to the support structure.

10. The method of claim 8, wherein the act of forming projections comprises the act of forming a computer chassis.

11. The method of claim 8, wherein the act of creating openings comprises the act of locating the openings through the circuit board.

12. The method of claim 8, wherein the act of creating openings comprises the act of shaping the openings with an insertion section and a catch section for the projections.

13. The method of claim 8, wherein the act of creating openings comprises the act of shaping narrowing slots.

14. The method of claim 8, wherein the act of creating openings comprises the act of shaping keyhole-shaped slots.

15. The method of claim 8, wherein the act of providing the latchable wall section comprises the act of integrally providing communications ports through the latchable wall section.

16. The method of claim 8, wherein the act of providing the latchable wall section comprises the act of hingedly coupling the latchable wall section to an open section of the support structure.

17. A tool-free mounting method for a circuit board, comprising the acts of:

forming a first portion of a multi-directional slot and projection interlock structure on the circuit board that is interlockable with a second portion of the interlock structure disposed on a support structure; and creating a tool-free mount on a releasable wall that is mountable adjacent an edge of the circuit board in a blocking position relative to at least one direction of a multi-directional interlocking motion for interlocking the first and second portions.

18. The tool-free mounting method of claim 17, wherein the act of forming the first portion comprises the act of creating a constricting slot through the circuit board.

19. The tool-free mounting method of claim 17, wherein the act of forming the first portion comprises the act of extending a projecting catch from the circuit board.

20. The tool-free mounting method of claim 17, wherein the act of forming the first portion comprises the act of creating a plurality of keyhole-shaped slots through the circuit board.

21. The tool-free mounting method of claim 17, wherein the act of forming the first portion comprises the act of creating a constricting slot and a projecting catch on the circuit board.

22. The tool-free mounting method of claim 17, wherein the act of forming comprises the act of manufacturing the circuit board.

23. The tool-free mounting method of claim 22, wherein the act of manufacturing the circuit board comprises the act of assembling motherboard circuitry for a computer system.

24. The tool-free mounting method of claim 17, comprising the act of removably mounting the circuit board to the support structure by interlocking the first and second portions via the multi-directional interlocking motion.

25. The tool-free mounting method of claim 24, further comprising the act of tool-lessly mounting the releasable wall against the edge.

26. A tool-free mounting method for a circuit board, comprising the acts of:

forming a first portion of a multi-directional slot and projection interlock structure on a support structure that is interlockable with a second portion of the interlock structure disposed on the circuit board;

providing a releasable wall section of the support structure that is tool-lessly mountable adjacent an edge of the circuit board in a blocking position relative to at least one direction of a multi-directional interlocking motion for interlocking the first and second portions.

27. The tool-free mounting method of claim 26, wherein the act of forming the first portion comprises the act of coupling a boss-shaped projection to the support structure.

28. The tool-free mounting method of claim 26, wherein the act of forming the first portion comprises the act of projecting a plurality of catch structures from the support structure.

29. The tool-free mounting method of claim 26, wherein the act of forming the first portion comprises the act of creating a constricting slot and a projecting catch on the support structure.

30. The tool-free mounting method of claim 26, wherein the act of forming comprises the act of manufacturing the support structure as a casing for a processor-based device.

31. The tool-free mounting method of claim 26, wherein the act of providing the releasable wall section comprises the act of creating a hinge mechanism for coupling the releasable wall section to the support structure.

32. The tool-free mounting method of claim 26, wherein the act of providing the releasable wall section comprises the act of integrally providing communications ports in the releasable wall section.

* * * * *